United States Patent
Makowiecki et al.

[11] Patent Number: 6,149,785
[45] Date of Patent: *Nov. 21, 2000

[54] APPARATUS FOR COATING POWDERS

[75] Inventors: Daniel M. Makowiecki; John A. Kerns, both of Livermore; Craig S. Alford, Tracy; Mark A. McKernan, Livermore, all of Calif.

[73] Assignee: The Regents of the University of California, Oakland, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/009,643

[22] Filed: Jan. 20, 1998

Related U.S. Application Data

[62] Division of application No. 08/627,162, Apr. 3, 1996.

[51] Int. Cl.[7] .................................................. C23C 14/35
[52] U.S. Cl. ............................. 204/298.28; 204/298.11; 204/298.15; 204/298.23; 204/298.24; 204/298.26; 204/298.29; 204/298.19
[58] Field of Search ........................... 204/298.11, 298.15, 204/298.23, 298.24, 298.26, 298.27, 298.28, 298.29, 298.19

[56] References Cited

U.S. PATENT DOCUMENTS

| | | | |
|---|---|---|---|
| 3,878,079 | 4/1975 | Schauer | 204/298.26 |
| 4,046,712 | 9/1977 | Cairns et al. | 204/192.15 |
| 4,536,482 | 8/1985 | Carcia | 204/192.15 |
| 4,560,462 | 12/1985 | Radford et al. | 204/298.28 |
| 4,940,523 | 7/1990 | Takeshima | 204/192.12 |
| 5,470,388 | 11/1995 | Geodicke et al. | 118/716 |

FOREIGN PATENT DOCUMENTS

| | | | |
|---|---|---|---|
| 5-271922 | 10/1993 | Japan | 204/298.28 |

OTHER PUBLICATIONS

Derment Abstract, "Metals and alloys powder coating—employing drum with vanes for transporting powders in vacuum chamber", SU 462656, May 1975.

*Primary Examiner*—Rodney McDonald
*Attorney, Agent, or Firm*—L. E. Carnahan; Alan H. Thompson

[57] ABSTRACT

A process and apparatus for coating small particles and fibers. The process involves agitation by vibrating or tumbling the particles or fibers to promote coating uniformly, removing adsorbed gases and static charges from the particles or fibers by an initial plasma cleaning, and coating the particles or fibers with one or more coatings, a first coating being an adhesion coating, and with subsequent coatings being deposited in-situ to prevent contamination at layer interfaces. The first coating is of an adhesion forming element (i.e. W, Zr, Re, Cr, Ti) of a 100–10,000 Å thickness and the second coating or final coating of a multiple (0.1–10 microns) being Cu or Ag, for example for brazing processes, or other desired materials that defines the new surface related properties of the particles. An essential feature of the coating process is the capability to deposit in-situ without interruption to prevent the formation of a contaminated interface that could adversely affect the coating adhesion. The process may include screening of the material to be coated and either continuous or intermittent vibration to prevent agglomeration of the material to be coated.

8 Claims, 7 Drawing Sheets

APPARATUS FOR COATING POWDERS

This is a Division of application Ser. No. 08/627,162 filed Apr. 3, 1996 pending.

The United States Government has rights in this invention pursuant to Contract No. W-7405-ENG48 between the United States Department of Energy and the University of California for the operation of Lawrence Livermore National Laboratory.

BACKGROUND OF THE INVENTION

The present invention relates to coating particles and fibers, particularly to coating powders and fibers to modify the physical and chemical properties thereof, and more particularly to a process and apparatus for producing adherent coatings on very small particles, powders, and fibers by magnetron sputtering two layers thereon without interface contamination.

Coatings make it possible to modify the physical and chemical properties of powders and small fibers. Coatings provide a method of improving the compatibility of powders, for example, with other materials and in certain processes. Diamond powder, for example, is coated with nickel, for example, to improve its electrical conductivity. Coated diamond is also used in composite grinding tools because it bonds better to most matrix materials than bare diamond. Diamond is one of only a few materials that are available as a coated powder. These coatings are generally prepared by electrochemical plating processes. Although coating uniformity is very good, coating adhesion is only marginal. The known commercial coating processes appear to have problems with flexibility, adhesion, or coverage. Further, there are no known coating processes that are capable of applying uniform and adherent coatings to small powders and fibers in the micron and submicron size. The potential benefit of a coated powder in most applications is determined by the quality of the coating, which includes its adhesive capability. Consequently, the benefits of using coated powders in many material processes has not been evaluated.

The above-referenced coating problems have been overcome by the coating process and apparatus of the present invention. The process of this invention has made it possible to apply an adherent and uniform coating to each particle in a powder sample, for example. Particles with diameters as small as one micron have been successfully coated by this process, which involves a two layer coating without layer interface contamination. The exceptional quality of the coating deposited on small particles and fibers by the process of this invention could lead to the development of improved composite materials and new fabrication processes. The process is carried out using magnetron sputtering of a first thin adhesion layer followed without interruption by at least a second thicker layer of desired material. Prior to coating, the particles and fibers are cleaned by a plasma cleaning operation. Uniformity of coating is maintained by agitation of the particles using the apparatus of the invention.

SUMMARY OF THE INVENTION

It is an object of the present invention to provide particles and fibers with a uniform and adherent coating.

A further object of the invention is to provide adherent coatings, on materials that have very little chemical affinity and exhibit poor adhesion to the material of the particle or fiber (e.g. copper to carbon).

A further object of the invention is to provide a process for coating particles in the micron size range with adherent and uniform coatings.

A further object of the invention is to provide a magnetron sputtering process for coating particles and fibers.

A further object of the invention is to provide an "in-situ" magnetron sputter-coating process capable of applying multiple coatings without interface contamination.

A further object of the invention is to provide a process for coating which involves movement of the material to be coated during the entire coating operation.

A further object of the invention is to provide an apparatus for carrying out the process of the invention.

Another object of the invention is to provide a coating process for small particles and fibers which involves agitation of the material being coated while applying the adherent coatings by in-situ magnetron sputtering, without interface contamination.

Another object of the invention is to provide a process for uniformly applying the adherent coating by vibrating or tumbling the particles or fibers during the coating operation.

Another object of the invention involves applying by magnetron sputtering material an initial coating of a material for adhesion followed by (one or more coatings) of other materials without interruption between the coats.

Other objects and advantages of the invention will become apparent form the following description and accompanying drawings. The invention broadly involves a process and apparatus for coating powder, small particles, and fibers. The process involves the following operational sequence: vibrating or tumbling the powder, particles, or fibers to promote coating uniformity; removing adsorbed gases and static charges from the powder, particles, or fibers by an initial plasma cleaning; and coating the powder, particles, or fibers with one or more layers of metals or ceramics by magnetron sputtering. In the magnetron sputtering operation the powder is first coated with a layer of a reactive metal for adhesion, and additional materials are deposited by in-situ magnetron sputtering to prevent contamination at layer interfaces. This combination of sputtering operations gives the process a unique capability for depositing uniform and adherent coatings on powder, small particles, and fibers. By depositing the additional layer or layers sequentially or simultaneously with the adhesion layer, in-situ, and without interruption, the formation of a contaminated interface that could adversely affect the coating adhesion is prevented. Prior to coating, gases adsorbed on the surface of the powder, particles, or fibers and any static charges thereon are removed by a plasma cleaning process which involves sputtering a magnetron source at low power in helium or hydrogen gas at low pressure for a specified time period after which the gas is changed to the sputtering gas (e.g. argon). Coating begins immediately after the plasma cleaning when the gas is changed to argon. In both the cleaning and coating operation, the powder, particles, or fibers are agitated in a tumbler or vibration apparatus to ensure uniformity of cleaning and coating.

A potential use for this invention is improved bonding of powders, particles, and fibers to other materials, such as the matrix material of various composites. A diamond-copper composite alloy with an isotropic thermal conductivity higher than any material except diamond was produced with diamond powder coated with an adhesion layer and a copper alloy. See copending U.S. application Ser. No. 08/247,090 filed May 20, 1994, entitled pending "Composite Material Having High Thermal Conductivity And Process For Fabricating Same," assigned to the same assignee. Also, metal coatings applied by this process can be used to increase the electrical conductivity of diamond and ceramic powders to improve the bonding of these materials in composite grinding tools or on cutting surfaces of grinding tools for polishing and lapping processes.

BRIEF DESCRIPTION OF THE DRAWINGS

The accompanying drawings, drawings, which are incorporated into and form a part of the disclosure, illustrate apparatus for carrying out the process of the invention and, together with the description, serve to explain the principles of the invention.

DETAILED DESCRIPTION OF THE INVENTION

The invention is directed to a process and apparatus for coating powders, small particles, or fibers. Coatings make it possible to modify the physical and chemical properties of powders, small particles, and fibers. The coated material provides a means for improving the compatibility thereof with other materials, thereby enabling, for example, the formation of composite materials utilizing the coated powder and small particles or fibers. The process of this invention has made it possible to apply an adherent and uniform coating to each particle or fiber in a batch. Particles with diameters as small as one micrometer have been successfully coated by this process.

The present invention involves uniformly coating powder, small particles, and fibers with adherent layers of one or more materials by magnetron sputtering. A unique feature of this in-situ multilayer coating process is the ability to deposit adherent coatings of materials that have little chemical affinity and typically poor adhesion to the particles and fibers (e.g. copper on carbon). The process involves agitating the material to be coated to promote uniform coverage by randomizing exposure of the particles surface to the sputter sources. This is accomplished by either vibrating the material at high frequencies with a piezoelectric crystal or tumbling the material in a manner similar to clothing in a clothes drier or concrete in a cement mixer. The vibrating approach is described hereinafter with respect to FIG. 1 while the tumbling approach is described with respect to FIGS. 2–5 and 9 with a combination of vibrating and tumbling being described with respect to FIGS. 6, 7, and 8A–8C. The material being coated is agitated by one of these approaches during the entire coating operation.

Prior to coating, gases adsorbed on the surface of the material (powder, small particles, and fibers) to be coated and static charges thereon are removed by a plasma cleaning operation. This involves sputtering one of the two magnetron sources at low power (30 watts D.C.) in helium (or hydrogen) gas at low pressure (60 millitorr). Very little coating occurs in the cleaning process because of the low mass of the helium atoms. After plasma cleaning for at least six minutes, the helium gas is replaced with high purity argon. Coating of the material begins immediately after the plasma cleaning operation when the helium gas is changed to argon. The first layer deposited on the material to be coated by magnetron sputtering is composed of a very reactive metal, such as titanium or chromium, for adhesion. This layer can be as thin as a few hundred angstroms thick. One or more additional layers of virtually any material are then deposited by magnetron sputtering onto the adhesion layer either sequentially or simultaneously without interruption to prevent the formation of a contaminated interface that could adversely affect the coating adhesion.

By way of example, the coating operation begins following the cleaning operation described above, by magnetron sputter coating suitable diamond powder or particles (diameter of 1–100 micron) with a layer or region (thickness of 100 to 1000 Å) of an adhesion metal, such as titanium (Ti), chromium (Cr), tungsten (W), rhenium (Re), W-26Re, and zirconium (Zr); followed by a layer or region (thickness of 0.1 to 10 microns) of virtually any sputterable material, such as copper (Cu) or silver (Ag). Magnetron sputtering is a well known deposition process and thus specific details thereof are deemed unnecessary. Magnetron sputtering is routinely used to deposit multilayer coatings (>100 layers) on flat substrates. The magnetron sputtering process of this invention can deposit similar multilayer coatings on particles and fibers.

Figure 1:
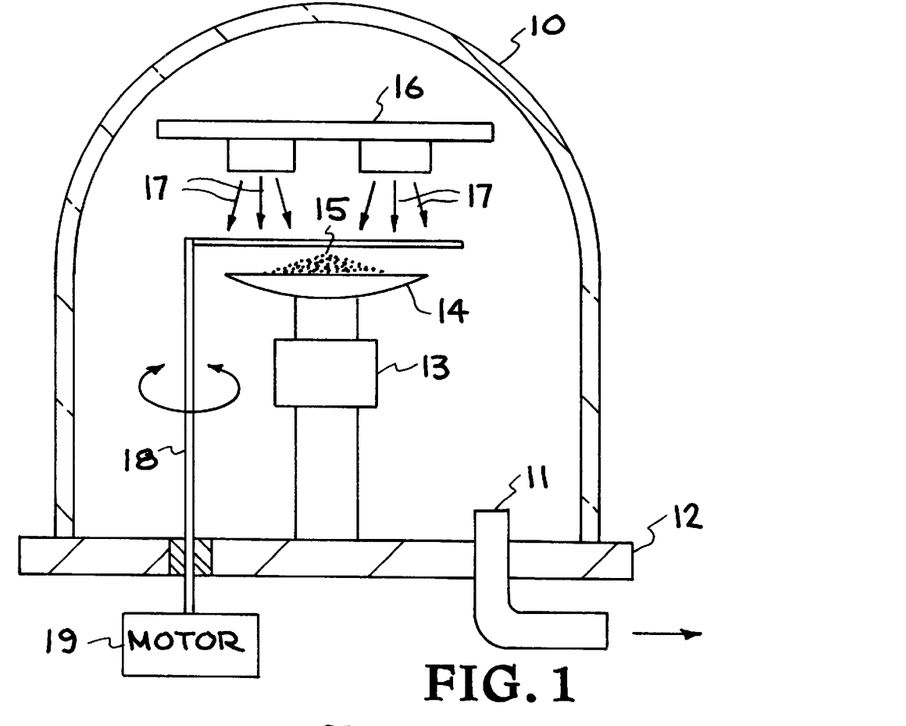
FIG. 1 illustrates an embodiment of a vibrating apparatus used in coating diamond particles in accordance with the process of the invention.

In the process of this invention, each particle is uniformly and completely coated with both the adhesion metal and the selected material layer or layers. This is accomplished, for example, by agitating a specific amount (about one gram) of diamond particles (powder) in a pan or container oscillated at high frequencies (28.01 to 28.99 kHz), by piezoelectric crystal, in an apparatus such as illustrated in FIG. 1 and described hereinafter. The amount of particles (powder) coated in a single pan is limited only by the size of the pan that can be vibrated at high frequencies by a piezoelectric crystal and a suitable power supply. The agitation of the particles can also be carried out by a tumbling motion in an apparatus such as illustrated in FIGS. 2–5 and described hereinafter. The thickness of the coating of certain second materials (i.e. Cu, Ag, Au) can be increased by lower cost and more rapid deposition technique such as electroplating or electroless plating without changing the quality of the coating.

The coating operation wherein powders (particles) are coated with an initial thin layer or region of an adhesion metal and a thicker layer or region of another material (metal, alloy, ceramic) may be carried out in the apparatus illustrated in FIG. 1, which is a 12 inch diameter glass bell jar vacuum system equipped with two 1 inch diameter magnetron sputtering sources. Referring to FIG. 1, the apparatus comprises a vacuum bell jar 10, vacuum line 11 in the base 12 of the bell jar 10 which supports a piezoelectric crystal assembly 13 and a pan 14 containing a fine powder consisting of 1–100 μ diameter particles 15, with the two 1 inch diameter magnetron sputter sources, indicated generally at 16, positioned above the pan and which produce atoms 17 for coating the diamond particles 15 which are being vibrated by the piezoelectric crystal assembly 13. A shutter mechanism 18 driven by motor 19 is positioned above pan 14 so as to cover and uncover the particles 15. For example, one of the sputter sources 16 has a tungsten (W) target with the other source 16 having a copper (Cu) target. The sputter sources 16 are positioned 3.75 inches from the diamond powder 15 contained in pan 14 comprising a 2.5 inch diameter stainless steel pan. The pan 14 is vibrated at 28.77 kHz by the piezoelectric crystal assembly 13.

Prior to metal coating the powder, such as diamond powder, it is cleaned and static charges are removed by exposure to a helium gas plasma created by magnetron sputtering a tungsten target at 30 watts D.C. power, while the particles (powder) are being agitated. The helium gas pressure is maintained at 60 millitorr (mTorr) with a flow rate of 20 sccm. After helium sputter cleaning for six minutes, the helium gas is replaced with high purity argon at 5.5 mTorr and a flow rate of 20 sccm. The magnetron sputtering source with the tungsten target is restarted upon change of the helium gas to argon and run at 30 watts about 90 minutes. The magnetron sputter source with the copper target is thereafter started and run for about 45 minutes at 20 watts of D.C. power. The co-deposition of tungsten and copper establishes a blended interface between the layers or regions of the separate metals without oxide contamination. The blended region can vary from a sharp interface of each metal to a blended alloy of a varying composition from 0 to 100%. The tungsten sputter source is turned off and copper is deposited at 20 watts for about 60 minutes and then at 60 watts for about an additional 60 minutes. At this point in the process the diamond particles have been uniformly coated with approximately 100 Å of tungsten and 1000 Å of copper.

Additional copper can be applied by sputtering; however, cold-welding will occur requiring periodic screening to break up agglomerates of the coated diamond powder. Also, the co-deposited region of blended copper and tungsten may be modified to establish a sharp interface between the individual layers of copper or tungsten, although the blended interface approach is preferred because it minimizes the risk of the formation of a contaminated interface that could adversely affect the coating adhesion.

Figure 2:
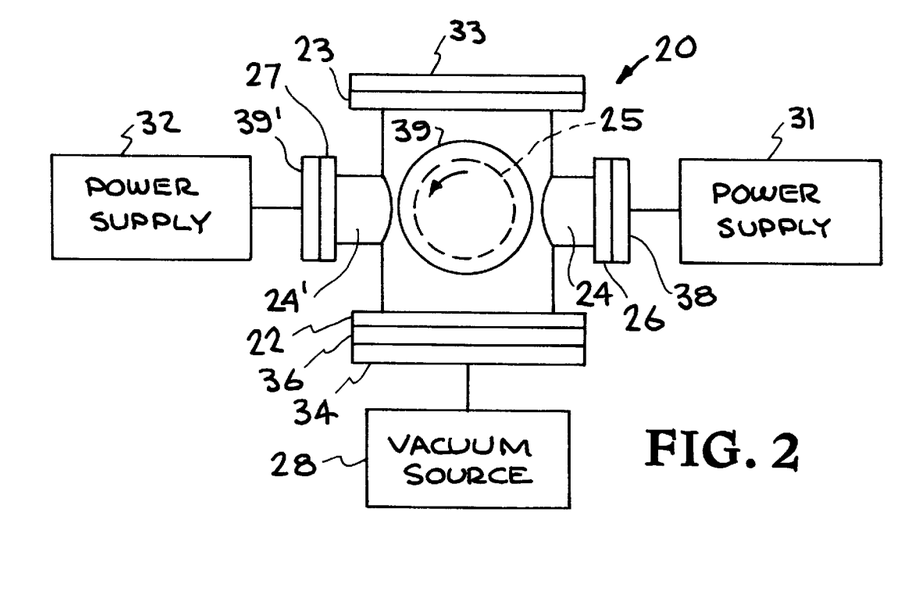
FIG. 2 schematically illustrates an embodiment of a tumbling apparatus between two horizontal sputter sources in accordance with the invention.
Figure 3:
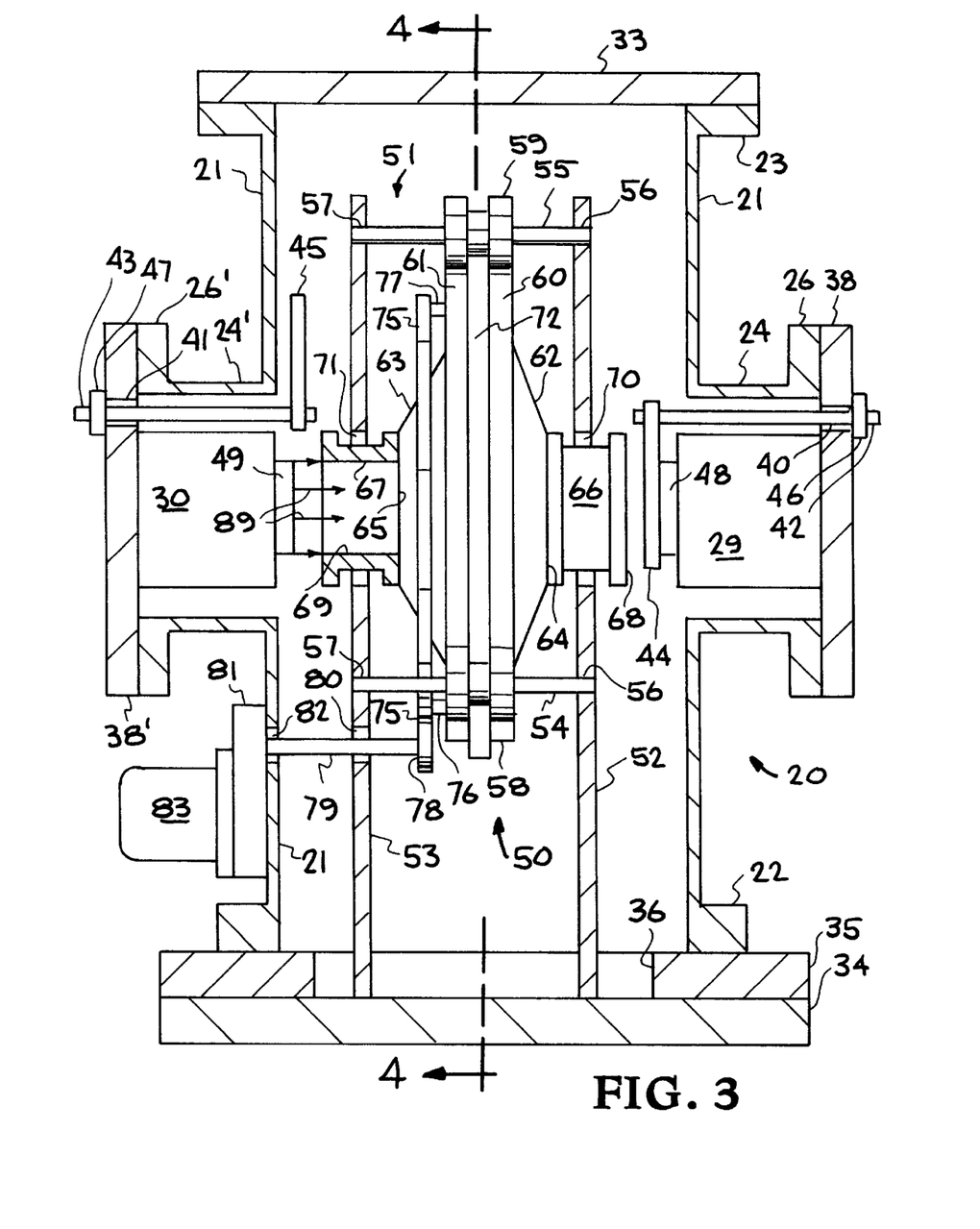
FIG. 3 is a partial cross-sectional view of the tumbling apparatus of FIG. 2.
Figure 4:
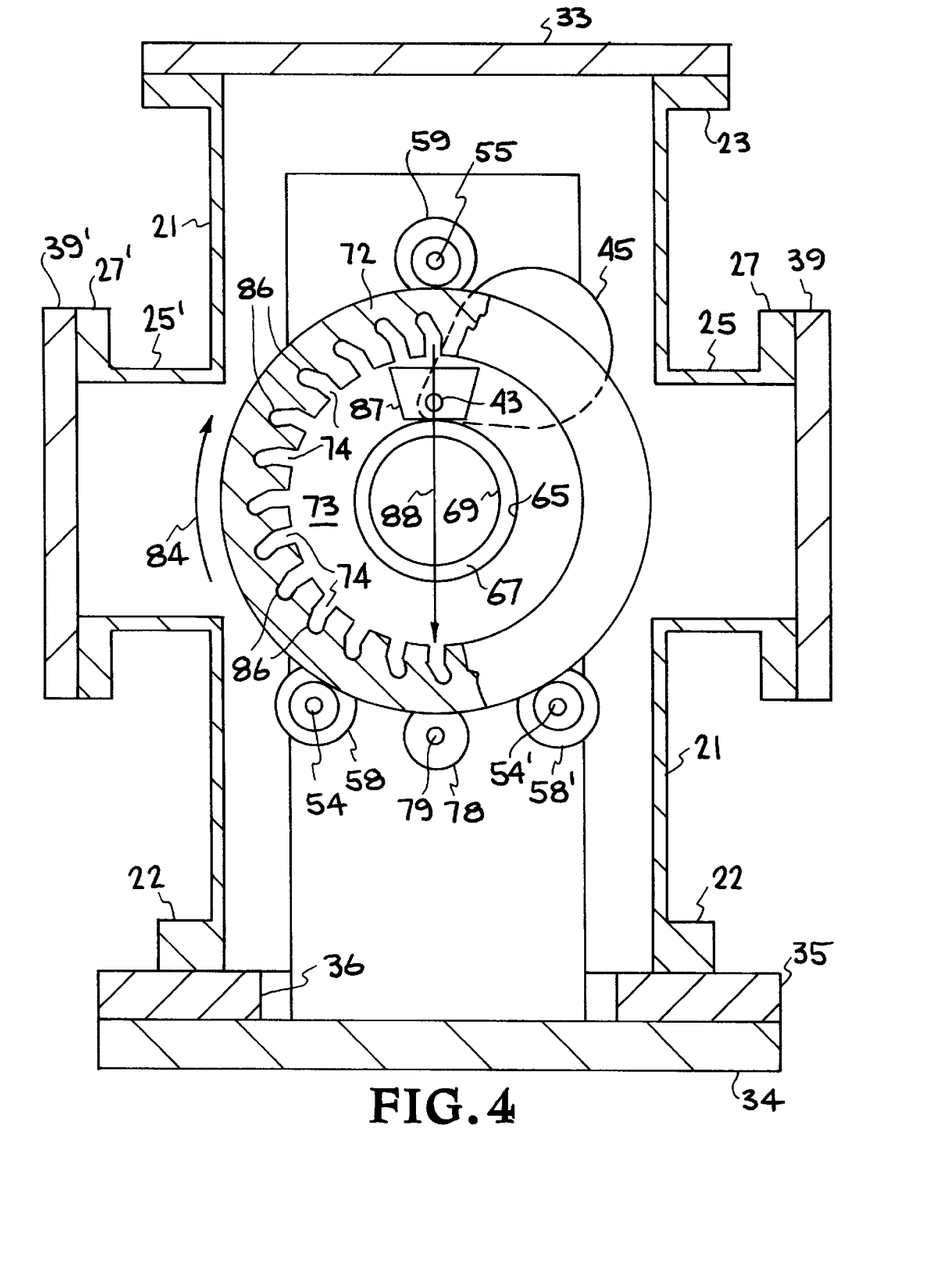
FIG. 4 is a view taken along the line 4—4 of FIG. 3.
Figure 5:
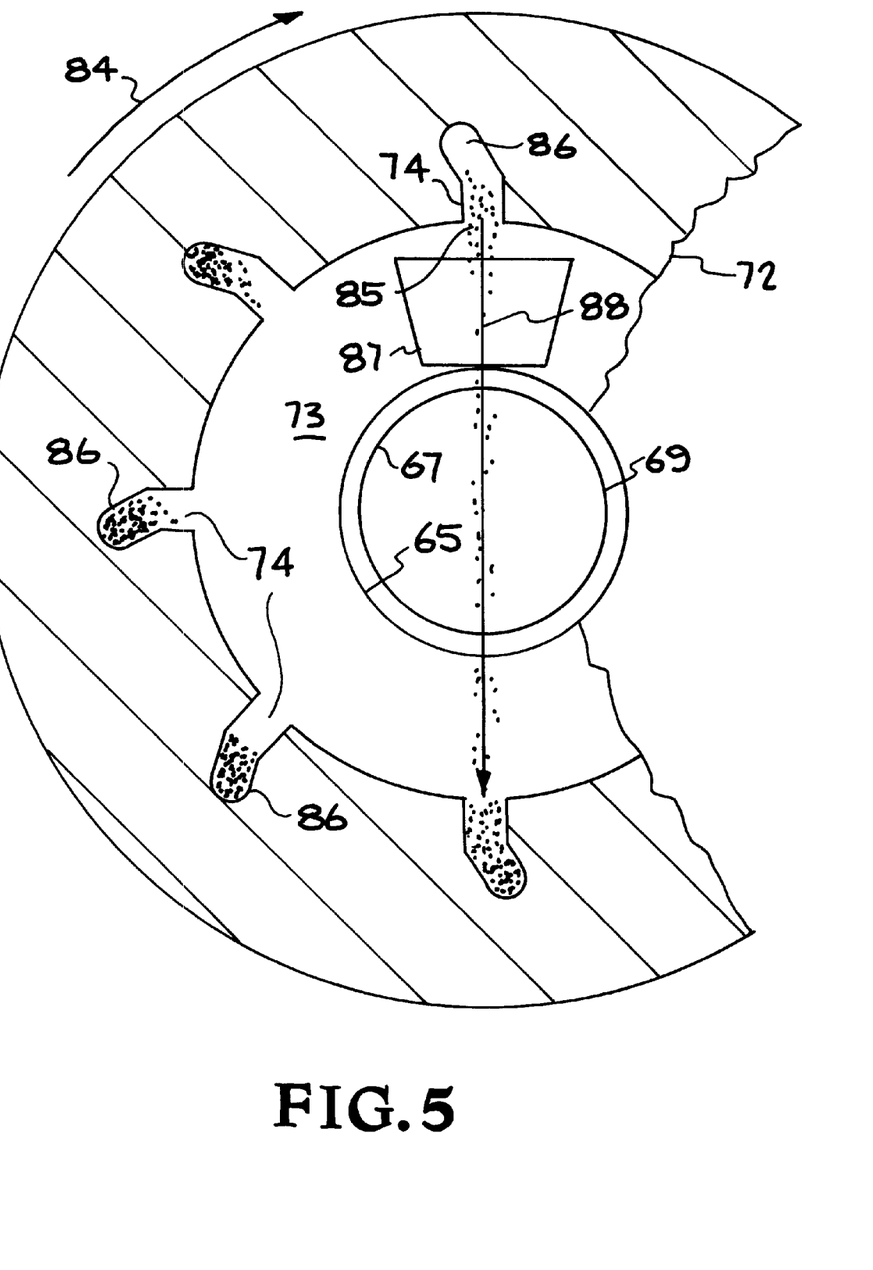
FIG. 5 is an enlarged simplified illustration of the tumbler of FIG. 4.

The cleaning and coating operations can be accomplished by tumbling the powder or particles in front of one or more sputter sources in a manner similar to clothing in a dryer, as shown in FIGS. 2–5. FIG. 2 illustrates the general components of an embodiment of an apparatus that tumbles the powder or particles between two horizontal sputter sources, with FIGS. 3 and 4 illustrating internal components thereof, and with FIG. 5 illustrating a simplified enlarged view of the tumbler of FIG. 4. The tumbling apparatus, generally indicated at 20 comprises a vacuum chamber or housing 21, flanges 22 and 23, and tubular sections 24, 24' and 25, 25' having flanges 26, 26' and 27, 27'. Flange 22 is connected to a vacuum source 28, with tubular sections 24 and 24' of housing 21 mounting a pair of magnetron sputtering sources 29 and 30 see FIG. 3, connected to respective power supplies 31 and 32. While not shown, the power supplies 31 and 32 may be connected to a computer system for controlling the magnetron sputtering sources 29 and 30. Flange 23 of housing 21 is closed by a top or cover plate 33, while flange 22 is connected to bottom plate 34 via an intermediate plate 35 having an opening 36. If desired intermediate plate 35 may be omitted with bottom plate 34 being secured directly on flange 22. Flanges 26 and 26' are closed by cover plates 38 and 38' having apertures 40 and 41 therein through which extend rotating shafts 42 and 43 connected to shutters 44 and 45 which are rotated in front of or away from magnetron sources 29 and 30. As seen in FIGS. 2 and 4, cover plates 39 and 39' are secured to flanges 27 and 27' of tubular sections 25 and 25'. Shafts 42 and 43 are rotated in timed sequence by a control mechanism, not shown, connected thereto via members 46 and 47. Each of magnetron source 29 and 30 is provided with a sputter target material 48 and 49. Positioned within housing 21 is a tumbler type coating mechanism, generally indicated at 50, whereby particles to be coated are tumbled, similar to clothing in a dryer to ensure uniform coating by the magnetron sources. Tumbler mechanism 50 is mounted via a support structure generally indicated at 51 composed of a pair of support members 52 and 53 interconnected via three shafts or axels 54, 54' and 55 (see FIG. 4) which are mounted in apertures 56 and 57 of members 52 and 53 respectively. Shafts 54 and 56 extend through a three dual pocket wheel guide rollers 58, 58' and 59 (see FIG. 4) which are in contact with a pair of pocket wheels 60 and 61. Secured to each of pocket wheels 60 and 61 is a pocket wheel shield 62 and 63 having central openings 64 and 65. A pair of coating/powder shields 66 and 67 are secured in openings 64 and 65 of pocket wheel shields and provided with opening 68 and 69. The coating/powder shields 66 and 67 extend through openings 70 and 71 in support members 52 and 53 and are aligned with target materials 48 and 49 of magnetron sources 29 and 30. Pocket wheels 60 and 61 are mounted on a pocket wheel drum 72 having a cavity 73 therein and a number of pockets 74 spaced around the drum 72, see FIG. 4. A gear type drive wheel 75 is secured to pocket wheel 61 via members 76 and 77 and is connected to a drive gear 78 driven by a drive shaft 79 which extends through an aperture 80 in support member 53, is connected to a rotating vacuum feed through 81 via aperture 82 in housing 21, and connected to a drive motor 83 mounted to housing 21.

Actuation of drive motor 83 causes rotation of the tumbler drum 72 as indicated by arrow 84 in FIGS. 4 and 5. As the drum 72 is rotated, powder or particles indicated at 85 previously deposited in the drum are entrained in the pockets 74 of various depths with the angled component or section 86 of pockets 74 to prevent the powder from falling from the pockets until it reaches the uppermost position at which time under the pull of gravity the powder 85 falls into a hopper or funnel 87 located in cavity 73 of drum 72 in the direction of arrow 88 (see FIG. 5) passing through the opening 69 through which a coating beam 89 (see FIG. 3) the target material 49, for example, from magnetron source 30 passes causing coating of the powder particles 85. The coating beam 89 exits the cavity 73 on the opposite side via the opening 68 of coating/powder shield 66, and impinges on the shutter 44 which is positioned to protect source 29 and target material 48. It is understood that when magnetron source 29 is activated a coating beam from target material 48 is directed into cavity 73 of tumbler drum 72 and shutter 45 is rotated so as to protect source 30 and target material 49 from the coating beam produced source 29. The continual agitation of the powder by the pockets 74 of drum 72 results in a uniform coating of the powder/particles 85. The entire assembly including the drive motor (a vacuum compatible design) 83, the sputtering sources 29 and 30, and the tumbler mechanism 50 can be internally mounted in a larger vacuum chamber than chamber or housing 21.

Figures 6, 7:
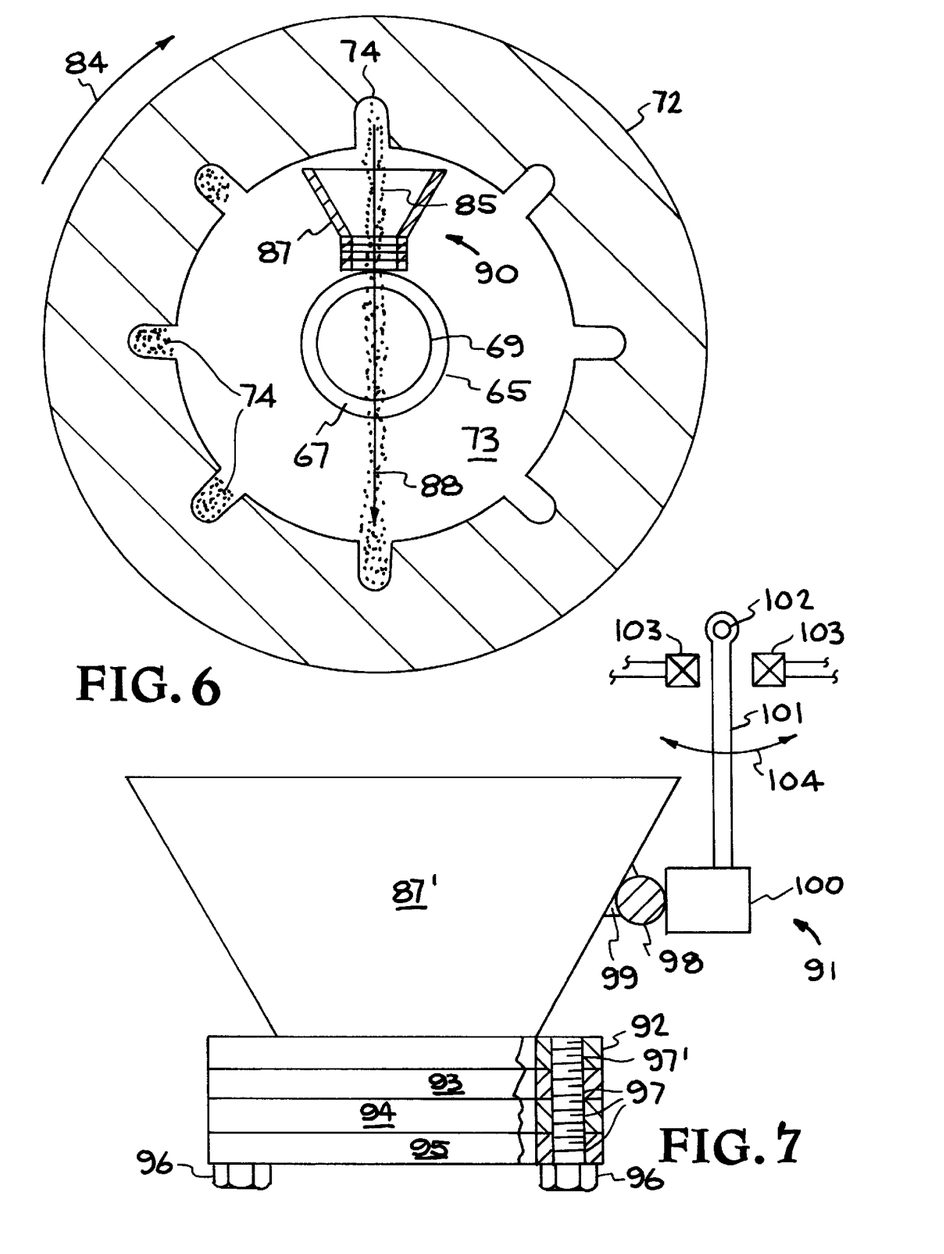
FIG. 6 is a simplified view of another embodiment using a tumbler and funnel as in FIG. 5 with screens attached to the funnel.
FIG. 7 is an enlarged view of the funnel of FIG. 6 with attached screens and vibrator arrangement.

A variation of the method of cleaning and coating of small diameter particles (1–30 μm) that have a tendency to agglomerate in the tumbling apparatus of FIGS. 2–5 is illustrated in FIGS. 6 and 7. This variation involves the addition of several mesh screens attached to the hopper or funnel and the use of vibrating motion of the screens and hopper or funnel.

As shown in FIG. 6, which is a modification of FIG. 5, a hopper or funnel 87' is provided at the lower end thereof with a mesh screen assembly indicated generally at 90 and shown in detail in FIG. 7. Also, in FIG. 6, the pockets 74 of drum 72 have been modified to eliminate the angled section 86 of FIG. 5. In the FIG. 6 embodiment the particles 85 pass through the mesh screen assembly 90 and cross the coating beam 89 for coating thereof by magnetron sputtering as described above with respect to the embodiment of FIGS. 2–5. Since as set forth above, smaller particles agglomerate easily, the addition of a vibrating mechanism for the hopper or funnel 87' and the mesh screen arrangement 90 has been found to be effective for preventing such agglomeration of the particles to be coated. An embodiment of a vibrating mechanism generally indicated at 91 is illustrated in FIG. 7, wherein hopper or funnel 87' is provided at the lower end with a flange 92 to which the mesh screen assembly 90 is attached and wherein the vibrating mechanism 91 is secured to a side section of hopper 87'. The mesh screen assembly 90 is composed of three (3) mesh screens in this embodiment, secured in frames indicated at 93, 94, and 95. The mesh screens 93, 94, and 95 are attached to flange 92 via thread members 96, which extend through openings 97 in mesh screens 93–95 and are secured in threaded openings 97' in flange 92. The top mesh screen 93 has larger openings than the openings in middle mesh screen 94, and bottom mesh screen 95 as smaller openings than middle mesh screen 94. For example screen 93 may be a 50 mesh (50 wires of 0.002–0.005 inch diameter by 50 wires per square inch). The middle mesh screen 94 may be a 70–100 mesh, and the bottom screen 95 may be a 100–200 mesh.

The vibrating motion is provided by the vibrating mechanism 91 in FIG. 7 which in this embodiment is a clapper type. The mechanism 91 in this embodiment is composed of a member 98 such as a ball or short rod secured as by welds 99 to hopper 87', a clapper 100 located at one end of a rod 101 pivoted at 102, with the rod 101 and clapper 100 being moved with respect to pivot 102 by an electromagnetic coil arrangement 103 as indicated by double arrow 104. The clapper 100 and electromagnetic coil arrangement 103 function similar to the classic motion involved in the ringing of a fire alarm bell, whereby constant striking of the member 98 by the clapper 100 causes vibration of the hopper 87' and attached mesh screen assembly 90, thereby preventing agglomeration of the small (1–30 μm) particles passing therethrough, while allowing larger particles, depending on the mesh size of the screen assembly, to pass through also. Also, vibration of the hopper and screen assembly enables the continuous flow of particles and prevents accumulation of the particles on the screens of the screen assembly. Also, low frequency vibration can be applied to the rotating drum 72 to prevent particles, particularly fine powder or particles from accumulating in the cavities 74. A variety of low frequency oscillators used in common devices such as door bells and vibrators can be used to vibrate the hopper and/or the rotating drum.

Figure 8A:
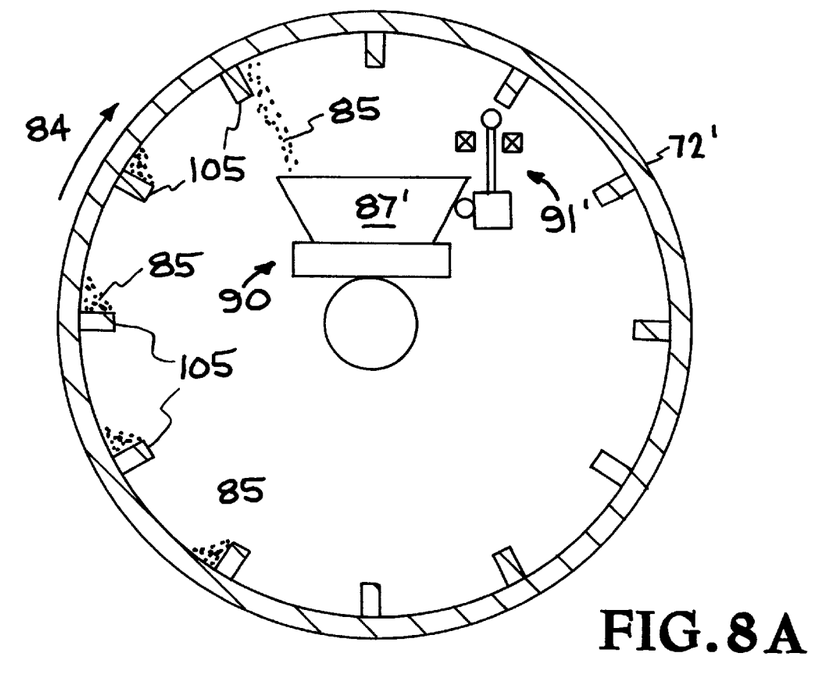
FIGS. 8A–8C illustrate another embodiment using a tumbler, including pick-up paddles as in a cement mixer, for filling the funnel then releasing the power from the funnel by vibration of the funnel.
Figure 8B:
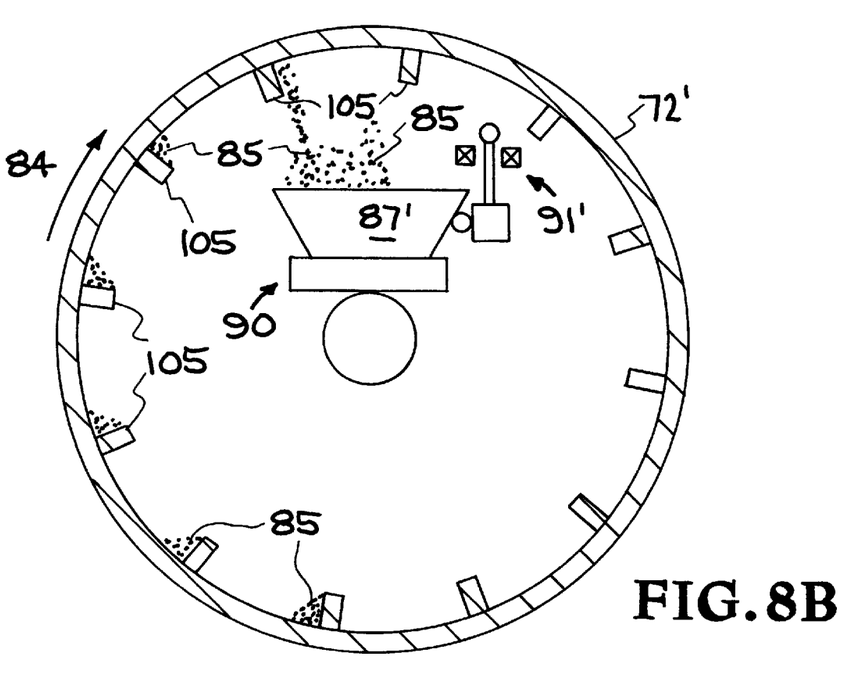
Figure 8C:
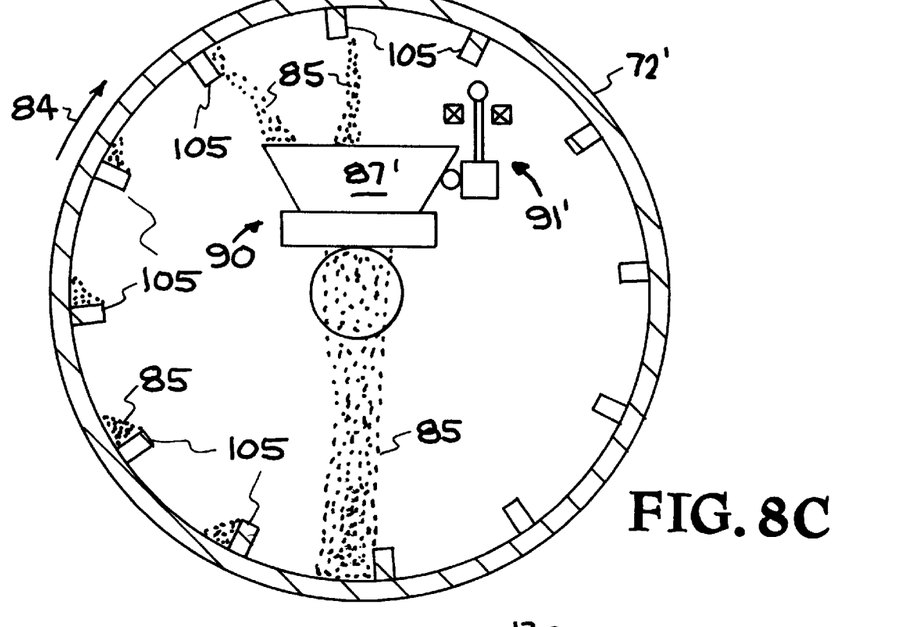

FIGS. 8A to 8C illustrate in partial cross-section an alternative to the method of tumbling particles or powder to be coated in front of one or more magnetron sputtering sources. Instead of a continuous motion analogous to clothing in a dryer the alternate method involves filling the screened hopper or funnel with particles or powder by a rotating drum before applying vibrating motion and flowing the material to be coated past the magnetron sources. This alternate process is no longer continuous, but semi-continuous, although the filling of the hopper can be carried out by continuous rotation of the drum. This process involves filling and gradually emptying a particle or powder-filled hopper or screened funnel. The process uses the continuous operation of paddles or members to fill the hopper, but the hopper is emptied periodically.

The apparatus illustrated in FIGS. 8A–8C is generally similar to that of the FIGS. 6–7 apparatus except paddles or protruding members are used to carry the particles instead of pockets, and the vibrating apparatus is activated only after the hopper is full. Thus, the particles or powder do not flow continuously through the funnel as in the embodiment of FIGS. 2–5 or the screened funnel or hopper of FIGS. 6–7 which uses constant or continuous vibration. As seen in FIGS. 8A, 8B, and 8C, the particles 85 are picked up via paddles or members 105 protruding from rotating drum 72' and drop into hopper 87' having a screen assembly 90' vibrating mechanism 91', as shown in FIG. 8A. The drum 72' continues to rotate whereby the hopper 87' is filled with particles 85, as shown in FIG. 8B, whereupon the vibrating mechanism 91' is activated and the particles 85 pass from the hopper via the mesh screen assembly 90, as shown in FIG. 8C. The emptying of the hopper is controlled by the operation of the vibrating mechanism, and upon emptying of the hopper the vibrating mechanism is deactivated allowing the hopper to refill as in FIG. 8B.

The non-continuous flow process of FIGS. 8A–8C has the advantages of better control of the density and distribution of the particles or powder as it flows in front of a magnetron sputtering source or sources.

Figure 9:
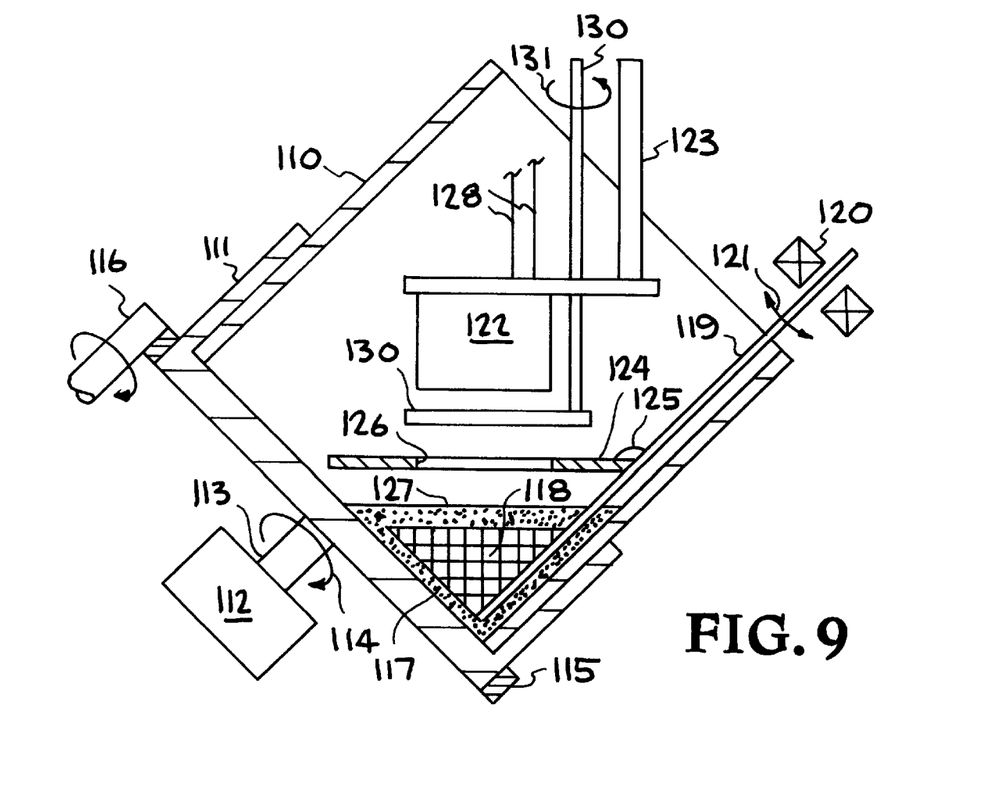
FIG. 9 schematically illustrates another embodiment using a tilted rotating drum, similar to a cement mixer, and wherein the powders are coated within the drum.

Another method of tumbling, which is significantly different from the above described methods, is described with respect to FIG. 9. In this method the coating of the powders or particles is not carried out during free-fall thereof as in the tumbling processes described above, but here the coating of the surface of the particles or powder is carried out by tumbling in the bottom of a rotating drum as in mixing concrete in a cement mixer. The drum is rotated at an angle less than vertical and greater than horizontal, preferably 45°±15°. The drum may be rotated by a centrally located drive or by a peripherally located drive. One or more screens are used for breaking up of powder agglomerations and scrapping the wall of the drum to prevent powder sticking. These screens can be vibrated as in the above-described embodiments, and the magnetron sputter source or sources are provided with protective shutters as described above. In addition the rotating drum is provided with a coating shield which allows the beam from the sputter source or sources to contact the surface of the particles for coating same.

Referring now to FIG. 9, the apparatus includes a drum 110 secured at one end in a rotating support fixture 111 which is driven by a canned vacuum motor 112 connected to the center of the support fixture 111 by a shaft 113, whereby the drum 110 can be rotated as indicated by the arrow 114. In larger applications, where greater turning torque is required, the support fixture can be rotated via a gear wheel 115 mount around the exterior thereof and driven via a gear 116 by a power source, not shown, but similar to a typical cement mixer. The drum 110 can be open at an opposite end to atmosphere or may be connected to vacuum system, not shown, depending on the composition of the coating material and/or material being coated. Note that the apparatus is positioned at a 45° angle from horizontal such that powder or particles indicated at 117 is filled to the center of the drum at a 45° angle. At least one screen 118 secured to a support rod 119 which extends from drum 110 and connected to solenoid coils 120 is located in the powder 117. The screen 118 is vibrated, as indicated by the double arrow 121, via coils 120 and rod 119 for breaking up powder agglomerates and scrapping the drum wall to prevent powder sticking thereto. The components 118–120 are mounted independent of the drum 110 and particles or powder 117. A magnetron sputter source 122 mounted in drum 110 via a support 123, with a coating shield 124 secured to drum 110 as by welding 125 and which includes an opening 126 located intermediate the powder surface indicated at 127 and source 122. Source 122 is operatively connected to a power supply and a cooling system as indicated by legends "power" and "$H_2O$" and lead lines 128 and 129. A movable shutter 130 extends between source 122 and shield 124 and is rotated as indicated by arrow 131 for covering and uncovering the source 122.

It has thus been shown that the present invention provides a process and apparatus for coating powders, small particles, and fibers (1–100 microns) with a thin 100–1000 Å adhesion layer, followed by at least one thicker (0.1–10 microns) layer of virtually any sputterable material. The coating is carried out utilizing magnetron sputter sources incorporated into an apparatus for agitating the material being coated. The agitation of the material can be carried by vibration or by tumbling.

While a specific operational sequence, specific apparatus, materials, parameters, etc. have been set forth to exemplify and explain the principles of the invention, such is not intended to be limiting. Modifications and changes may become apparent to those skilled in the art, and it is intended that the invention be limited only by the scope of the appended claims.

What is claimed is:

1. An apparatus for coating material including powder, particles, and fibers, comprising:

a housing, means located in said housing for retaining the material to be coated, means for agitating the material to be coated, a pair of oppositely located magnetron sputtering for coating the material while the material is being agitated, wherein the means for retaining the material to be coated comprises a rotating drum positioned between said oppositely located magnetron sputtering sources, said drum including a plurality of means for picking up, moving, and releasing the material to be coated, and means for rotating said drum, said rotating drum being located intermediate said magnetron sputtering sources, said means for picking up, moving, and releasing the material being constructed to release material to be coated at an uppermost point of rotation of said drum, whereby material to be coated falls past the magnetron sputtering sources so as to be coated thereby as the material falls, a hopper into which the material first falls before being coated, and a mesh screen assembly connected to said hopper.

2. The apparatus of claim 1, additionally including shutter means for each magnetron sputtering source.

3. The apparatus of claim 1, wherein said means for picking up, moving, and releasing the material, comprises a plurality of pockets.

4. The apparatus of claim 1, additionally including means for vibrating said hopper and said mesh screen assembly.

5. An apparatus for coating material by sputter deposition, comprising:

a housing, means located in said housing for retaining material to be coated, said means for retaining material to be coated comprises a tumbling mechanism, and additionally including means for rotating the tumbling mechanism, means for agitating the material to be coated to provide uniform coating of the material, a plurality of magnetron sputtering sources for coating the material while the material is being agitated, means on said tumbling mechanism for carrying the material to be coated to an upper region thereof, whereby the material to be coated falls by gravity past said magnetron sputtering sources, a hopper in the upper region of said tumbling mechanism whereby material carried to the upper region thereof first falls into said hopper, and said tumbling mechanism being provided with means for breaking up particle agglomerations in said hopper.

6. The apparatus of claim 5, additionally including shutter means for said magnetron sputtering sources.

7. The apparatus of claim 5, wherein said plurality of magnetron sputtering sources comprises two oppositely located sources.

8. The apparatus of claim 5, wherein said hopper is provided with a mesh screen assembly, and said means for breaking up particle agglomerations comprises means for vibrating said hopper and said mesh screen assembly.

\* \* \* \* \*